United States Patent [19]

Radomirov et al.

[11] 4,422,065

[45] Dec. 20, 1983

[54] METHOD FOR READOUT FORM MULTISCALE ENCODERS AND A MULTITURN ABSOLUTE ANGLE-CODE CONVERTER

[75] Inventors: Radomir V. Radomirov; Kolyo R. Kolev, both of Stara Zagora; Encho M. Enchev, Nova Zagora; Ivan N. Ivanov, Gabrovo, all of Bulgaria

[73] Assignee: Nauchno Proizvodstven Kombinat Po Robotika "Beroe", Stara Zagora, Bulgaria

[21] Appl. No.: 113,292

[22] Filed: Jan. 18, 1980

[30] Foreign Application Priority Data

Jan. 18, 1979 [BG] Bulgaria ................................ 42122

[51] Int. Cl.³ ............................................ H03K 13/18
[52] U.S. Cl. .......................... 340/347 P; 250/231 SE; 340/347 M
[58] Field of Search ....................... 340/347 M, 347 P; 250/231 SE

[56] References Cited

U.S. PATENT DOCUMENTS 3,999,022 12/1976 Hosemann ..................... 340/347 M

OTHER PUBLICATIONS

Susskind, Notes on Analog-Digital Conversion Techniques, The Technology Press of MIT and J. Wiley & Sons, Inc., 1957, pp. 6-60 to 6-49 and 6-60 to 6-64.

Primary Examiner—T. J. Sloyan

[57] ABSTRACT

Method for readout from multiscale encoders wherein the fine readout digits information signals formed in Gray code by means of light flux modulation from the fine readout code mask graduations are transformed into electrical signs by photosensitive read elements. Interaction of the sensing element with the most significant digit code intervals of the full range fine readout masks forms an imitating electrical signal, the logical level transition of which occurs every time that the coarse readout digits information signals logical level must be changed. Through the interaction of the coarse readout mask digital tracks with pairs of sensing elements, for each digit there are formed pairs of auxiliary electrical signals, the interval between two adjacent edges of which is shorter than the period of the imitating electrical signal and includes all positions in which the coarse readout digit information signal must change its logical state, from the code intervals of which the given pair of auxiliary signals is formed.

The invention includes a muetiturn absolute angle-code converter for use with the above method, the converter, having two code mask disks for coarse and fine readout which are kinematically joined by means of gear transmission, and readout elements which are located over the digital tracks of the fine readout mask.

2 Claims, 4 Drawing Figures

4 – IMITATING AND READ PHOTODIODES OF THE FINE READOUT CODE MASK

5 – COUPLES OF AUXILIARY PHOTODIODES OF THE FINE READOUT CODE MASK

6 – COUPLES OF AUXILIARY PHOTODIODES OF THE COARSE READOUT MASK

METHOD FOR READOUT FORM MULTISCALE ENCODERS AND A MULTITURN ABSOLUTE ANGLE-CODE CONVERTER

This application is related to the application of Ivanov et al., Ser. No. 753,569, filed Dec. 22, 1976, now abandoned.

This invention relates to a method for readout from multiscale encoders and a multiturn absolute angle-code converter with application in the fields of robot development, automatic control systems and information systems.

A method for readout from multiscale encoders is known into which the digital data signals for fine readout form a Gray Code by means of light flux modulation from fine readout code mask graduations, transformed in electrical signals by photosensitive read elements.

For matching the read elements readouts of the masks for coarse and fine readout, front and trailing edges of coarse readout digits information signals are formed, so that the light flux through the code graduations of the coarse readout mask are additionally modulated from the auxiliary spiral raster on the fine readout mask.

The drawbacks of this method are: the requirement for a high accuracy gear transmission without play upon reversing; the overlapping of the scales extends the optical axis length and increases the light flux losses, thus restricting the use of optocouples; the need of an auxiliary spiral mask brings additional technological difficulties in manufacturing, assembly and adjustment of the code masks.

In most servocontrolled industrial robots with sensors in feed-back circuits, multiturn absolute photoelectric angle-code converters are used.

Multiturn angle-code converters are known, in which two transparent disks graduated with round Gray Code masks are used as basic functional elements. A multistage gear transmission joins the disks with a ratio dependent on the number of digital tracks on the coarse readout code mask:

$$i = 2^{n-1} \quad (1)$$

where n is the number of digital tracks on the coarse readout mask. Photoelectrical sensors are fixed at one side of the disks, while the light sources are located on the opposite side.

The use of two kinematicaly joined disks requires precise adjustment of the readouts from the sensors in binary code, for which the following conditions are compulsory: sensor alignment accuracy along readout lines, which is especially important for coarse readout mask elements; high precision interposition adjustment of the readout lines and code masks of both disks; a high accuracy gear transmission without play upon reversing.

Feed-back sensors are also known, which are used as multiturn angle-code converters with forced readout adjustment. An auxiliary spiral strip mask is laid on the fine readout disk periphery. The two disks are mounted at different heights on two axes so that the scales are partly overlapped. The conjugation of the fine readout disk spirals and the coarse readout disk graduations (transparent and opaque) is used to adjust the sensor readouts. Thus the errors due to inexact adjustment of coarse readout mask sensors and to inexact interposition adjustment of the readout lines and code masks of the two disks are compensated to a certain degree.

The drawbacks of this type of multiturn angle-code converters are: requirement for high accuracy gear transmission without play upon reversing; the scales overlapping extends the optical axis length, increases the light flux losses, thus restricting the use of optocouples, the need of an auxiliary spiral mask brings additional technological difficulties in fine readout disk manufacturing; the uncoaxiality of the scales leads to increased converter overall dimensions.

The objective of this invention is to provide a method for readout from multiscale encoders and a multiturn absolute angle-code converter with improved metrological characteristics, simplified constructional and technological requirements.

According to the invention there is provided a method for readout from multiscale encoders in which information signals from fine readout digits form Gray code by the interaction of read sensing elements with digital code tracks of the fine readout mask, forming auxiliary electrical signals, called imitating, extracted by interaction of the sensing element with the most significant bit of a full scale standard fine readout mask. The change of imitating signal logical level occurs every time when a theoretical change of coarse readout digits information signals logical level must occur.

For matching the information signals from coarse and fine readouts, with every coarse readout digit there is formed a pair of auxiliary signals, the logical levels of which comprise $2^2$ binary patterns: 00,01,11,10.

Intervals without coincidence of logical levels (01,10) between two adjacent fronts of auxiliary electrical signals, are two times shorter than the imitating signal period. These intervals are allocated symmetrically to the positions of the theoretical transition of the corresponding coarse readout digits information signal logical level. Since these positions coincide with those of imitating signal logical level transitions (front and rear edges), the same is used to form coarse readout information signals on the intervals with auxiliary signals logical level binary patterns 01 and 10; for this purpose according to the Gray Code in the first pattern the noninverted and in the second the inverted imitating signal are used.

On remaining intervals (00,11) with the auxiliary signals logical level coincidence, coarse readout digits information signals are formed in accordance with the Gray code: in the first pattern from logical level "0", in the second—from logical level "1".

Thus the information signals logical levels transition (from and rear edges) for all coarse readout digits is imitated from one and the same electrical signal, formed from the code intervals of the fine readout most significant digit, thus resulting in the full matching of the coarse and fine reaadout digits information signals.

According to the invention there is provided a multiturn absolute angle-code converter in which, to avoid the influence of gear transmission parameters and the code mask and sensors interposition errors on the angle-code conversion accuracy and reliability, the read sensors are located only on the fine readout code mask, and auxiliary elements are included, fixed in couples over the coarse readout mask digital tracks, and every couple of elements comprises an angle $\pi/i$ symmetrical to a fictive readout line. "Fictive readout line" means the line over which there are usually located coarse readout mask sensors (these sensors are absent in the invention).

An imitating sensor is added to the fine readout code mask sensors, situated on a track with one transparent and one opaque graduation, for instance on the readout line over the most significant digit of a full range code mask.

Switches for each bit are included in the angle-code converter electronic circuitry, the outputs of which form the coarse readout mask information bus. These switches are driven from the coarse readout mask couples of auxiliary elements. Depending on the state of the couples, comprising a four binary pattern, in accordance with a preliminary set sequence, inverted or noninverted outputs of imitating elements, source of logical level "0" or "1", are switched to the bus.

Thus, depending on the transmission ratio $i=2^{n-1}$, each time when theoretically must occur a graduation transition from a given digital track on the fictive readout line of the coarse readout mask, this transition practically occurs on the imitating element readout line of the fine readout code mask. The change of the auxiliary elements binary patterns is completed when the middle of the corresponding graduation of the imitating element digital track coincides with its readout line, and therefore the reduced to the fine readout code mask maximum allowable instrumentation error, due to play, improper interpositionning of the code mask and the couples of auxiliary elements, improper manufacturing of the coarse readout code mask and etc., may reach $\pm \pi/2$, without affecting the angle-code conversion accuracy.

The advantages of this invention are: full matching of the parallel readouts from the two code masks in a very large allowable range of an instrumentation error variation up to $\pm \frac{1}{4}$ of the imitating signal period, which for round code masks comprises $\pm \frac{1}{4}$ of the fine readout code mask turn, enabling the reduction of the accuracy requirements for basic functional elements manufacturing and assembling of the multiscale encoders; reduction of the optical axis length, enabling the use of optocouples; the method permits two scales to be mounted onto two separate kinematically joined objects, enabling the synthesis of multiturn encoders from two single scale coders; the possibility of coaxial assembling of two scales, thus resulting in overall dimensions reduction of the encoder.

An example of a practical realisation of the invention is shown in the included figures and tables, wherein.

Figure 1:
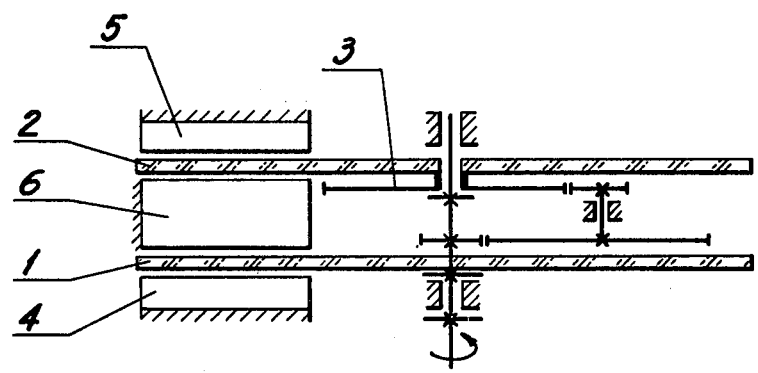
FIG. 1 is a kinematic diagram of the converter.

Table 1 is a truth table of the switches;

Tables 2 and 3 are diagrams of the imitating photodiode and photodiode couples of the coarse readout code mask states in accordance with the rotation angle of the fine readout code mask.

The two scales are transparent disks 1 and 2 (FIGS. 1 & 2), graduated with eleven bit and five bit Gray code masks for fine $M_1$ and coarse $M_2$ readout, respectively. The two scales are kinematically joined through a two stage gear transmission 3 (FIG. 1) with a transmission ratio $i=2^4$. The fine readout scale is joined through a chair or gear-chain drive to the moving object, for instance to the module axis of the rotational motion of an industrial robot. The converter optocouples are constructively divided into three separate blocks. Block 4 comprises the imitating and read photodiodes of the fine readout code mask, block 5 comprises the couples of auxiliary photodiodes of the coarse readout mask; and block 6 comprises LED's, comprising optocouples with photodiodes from blocks 4 & 5.

The read photodiodes $C_0, C_1, C_2, \ldots C_9$ (FIG. 2) are located along the readout line I—I on the ten digital tracks of the code mask $M_1$. The eleventh digital track is excluded from the code mask $M_1$ and is used to match the readouts. The imitating photodiode C is located on this track along the readout line I—I. The outer track of the coarse readout code mask performs the function of the eleventh digital track. Thus, a 15 digit multiturn encoder is composed of two standard code masks totalling 16 digits.

Five photocouples are located over the five digital tracks of the coarse readout code mask scale $(C_{10})_1, (C_{10})_2, \ldots (C_{14})_1, (C_{14})_2$, at an angle $$\phi = \frac{k \cdot 2^{j+1} + 1}{i} \cdot \pi \quad (2)$$

where $\rho j$ is the angle between photocouple located on the j-th digital track; $j=1,2,3,\ldots n=5$—the consecutive number of the coarse read-out scale digital tracks, starting from the least significant digit (11-th digit); n—the number of digital tracks; $k=0,1,2,\ldots \infty$; $\pi$—angle dimension of the imitating photodiode track graduation; $i=2^{n-1}=2^4$—gear transmission ratio of the two scales.

Photodiodes are connected through buffers F directly to the information bus and to the corresponding switches $K_n-K_{15}$.

For the two inner tracks it is supposed that $\rho_n = \rho_{n-1}$.

Figure 2:
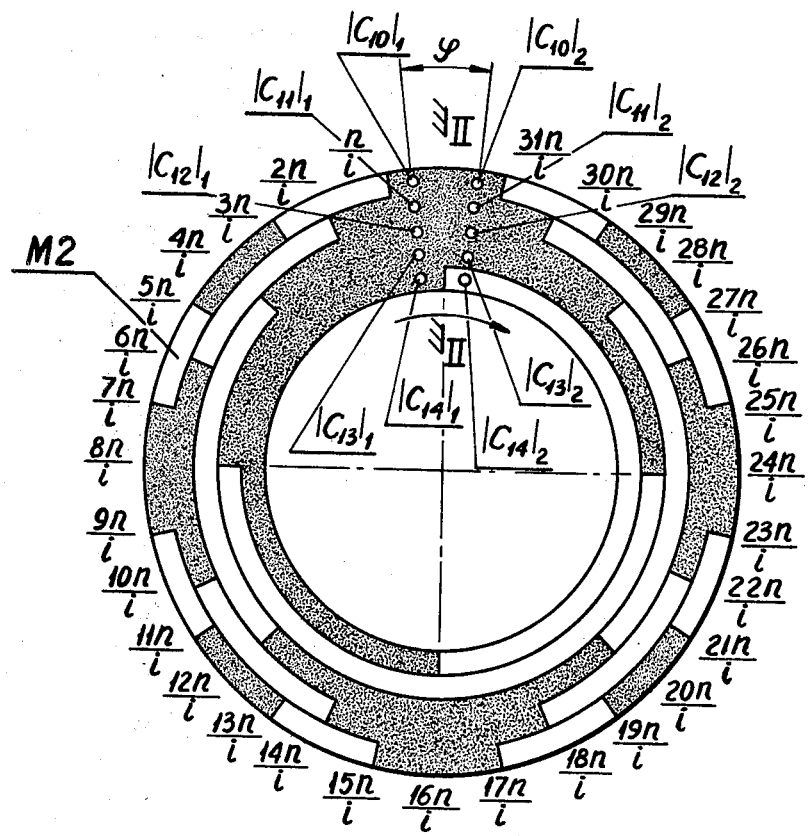
FIG. 2 is a drawing of photodiodes positioning over the digital tracks of the two code masks.
Figure 2:
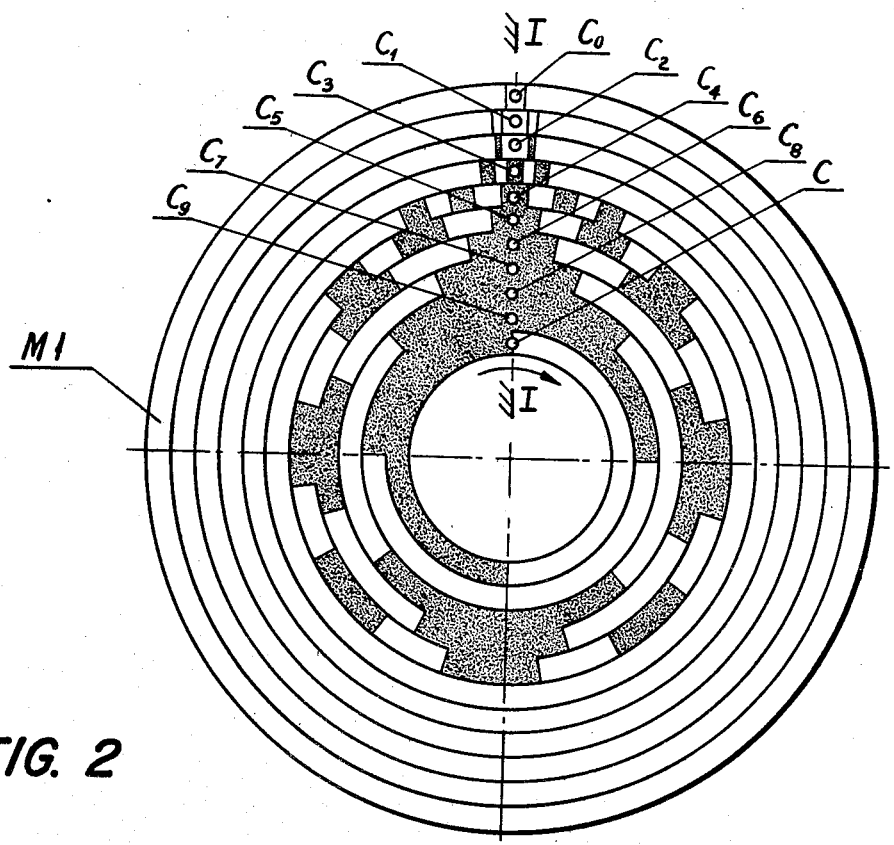

In the case shown on FIG. 2 all photocouples are allocated symmetrically to a fictive readout line II—II at the same angle $\rho = \pi/i = \pi/2\,4$, calculated from equation (2) when $k=0$.

Photodiodes of the two scales are illuminated through the transparent graduations of the corresponding code masks from LED's with which they compose optocouples.

Figure 4:
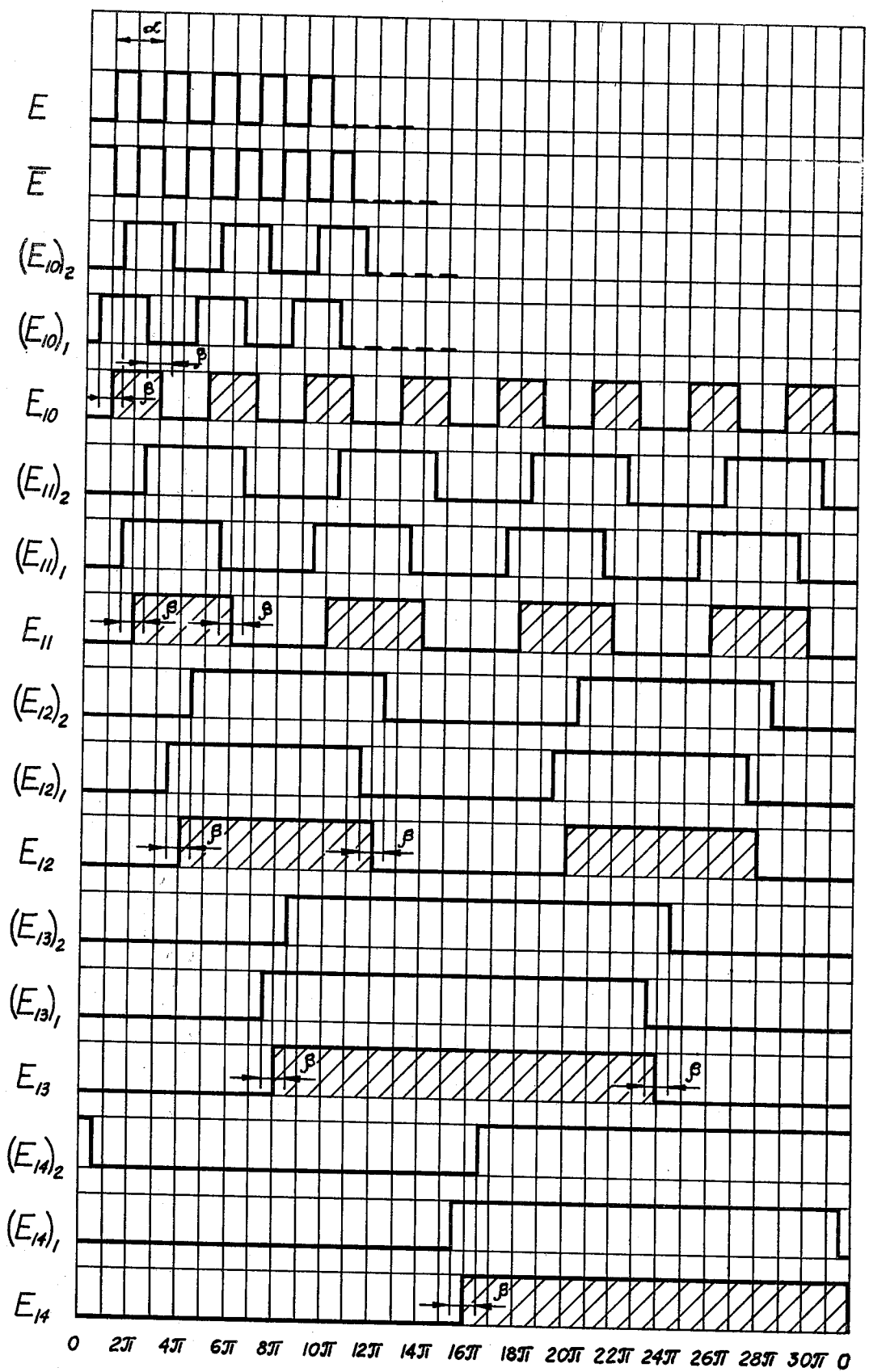
FIG. 4 is a diagram of auxiliary electrical signals, coarse readout digits information signals, inverted and noninverted imitating electrical signals depending on fine readout mask rpm's.

The light flux downwelling on the sensors is modulated from the opaque graduations of the corresponding digital tracks of the two rotating scales, and after amplification are transformed into electrical signals with two logical levels "0" or "1" (FIG. 4). The low level (logical 0") is formed from opaque graduations, and the high level (logical "1") is formed from transparent graduations of the digital tracks.

Electrical signals from photodiodes $C_0, C_1, \ldots C_9$ throughbuffers F (FIG. 3) are supplied directly to the information bus corresponding digits $1, 2, \ldots 10$. Bus 11, 12, 13, 14, and 15 of the remaining 5 digits are connected to the outputs of the switches $K_{11}-K_{15}$(multiplexors) in an integrated circuit design—K155 K117.

The photodiode C of the most significant bit of the fine readout mask $M_1$ forms imitating electrical signal E (FIG. 4) with period $a=2\pi$.

The optocouples $(C_{10})_1, (C_{10})_2, \ldots (C_{14})_1, (C_4)_2$ form respectively the pairs of auxiliary electrical signals $(E_{10})_1, (E_{10})_2, \ldots (E_{14})_1, (E_{14})_2$.

The coarse readout digits information signals $E_{10}, E_{11}, \ldots E_{14}$ are formed as follows:

to the 10-th coarse readout information bus there is connected either imitating signal E or inverted imitating signal $\bar{E}$ depending on the auxiliary signals $(E_{10})_1,(E_{10})_2$ binary value 1,0 or 0,1 respectively in the interval $\beta$ between two adjacent fronts;

to the 10-th information bus there is connected either a logical levels "0" or "1" sources depending on the auxiliary signals $(E_{10})_1,(E_{10})_2$ binary value 0,0 or 1,1 respectively.

Thus for each period, equal to $4\pi$, through which the fine readout scale turns, the information signal $E_{10}$ is formed through 4 successive switchings to its corresponding bus of signal E, level "1", signal E and level "0". Since the front and rear edges of the information signal $E_{10}$ are formed respectively from the front and rear edges of the signals E and $\bar{E}$ through the fine readout mask $M_1$ element C, a full matching of the $E_1$ signal with information signals of the fine readout digits is provided. Thus error sequences of 0's and 1's on the coarse and fine readout digits information bus are eliminated. The interval $\beta$ between adjacent edges of the auxiliary signals must be less than the imitating electrical signal E period $\alpha = 2\pi$. The optimal case is when $\beta$ equals $\alpha/2$ and is located symmetrically to the positions of the theoretical logical level transitions of the corresponding coarse readout digit information signal. This allows the keeping of the readout accuracy from both converter code masks even when the misadjustment angle of the mask $M_1$ to mask $M_2$ is as big as $\pm\pi/2$.

Information signals $E_{11}, E_{12}, E_{13}$ and $E_{14}$ are formed in a similar way with the only difference that to the corresponding bus are connected either an inverted imitating signal $\bar{E}$ or a noninverted imitating signal E depending on the auxiliary signals binary value 1,0 or 0,1 respectively.

The functioning of the invented unit is as follows:

The processed electrical signals from the optocouples are supplied to the control inputs $A_0$ and $A_1$ of the switches, comprising a $2^2$ binary pattern, by means of which one of the controlled inputs 0,1,2,3, of the switches can be connected to the corresponding bus digit. The controlled inputs of the switches are fed either by "0","1" and the imitating photodiode "C" inverted or noninverted outputs. The switching of the controlled inputs to the corresponding information bus digit can be performed with a strobe or without it.

On FIG. 2 there is shown the rotation of the two scales while performing the transition from $2^{15}-1=32767$ to 0, when a new cycle begins.

One full rotation cycle consists of $2^4=16$ turns of the fine readout scale and one turn of the coarse readout scale.

The invention is based on the specific property of the Gray Code to have only one transition form transparent graduation to opaque or contrariwise only in one digit when changing the number by $\pm 1$.

In accordance with the gear transmission ratio, at each fine readout scale half turn $(0,\pi,2\pi,3\pi,\ldots 31\pi)$(FIG. 1) over the readout line II—II of the coarse readout scale there occurs a transition from one graduation of a given digital track to the other, which could be sensed by the corresponding photodiode, if over the readout line II—II there are located photodiodes. According to the invention the transition mentioned above is sensed by the imitating photodiode C located over the readout line I—I for which on every half turn of the fine readout scale there occurs a graduations transition.

In Table 2 there is given the relationship for determining the transition type, sensed by the imitating photodiode C in the case of even or odd numbers $\pi$ turns of the scale $M_1$, beginning from the starting point shown in FIG. 1.

Depending on the type of graduation transition of the code mask $M_2$ digital tracks, the inverted $\bar{C}$ or non-inverted C output of the imitating photodiode is used (FIG. 3) and connected by means of a corresponding switch to the information bus. The digital switches are controlled by optocouples according to Table 3.

Figure 3:
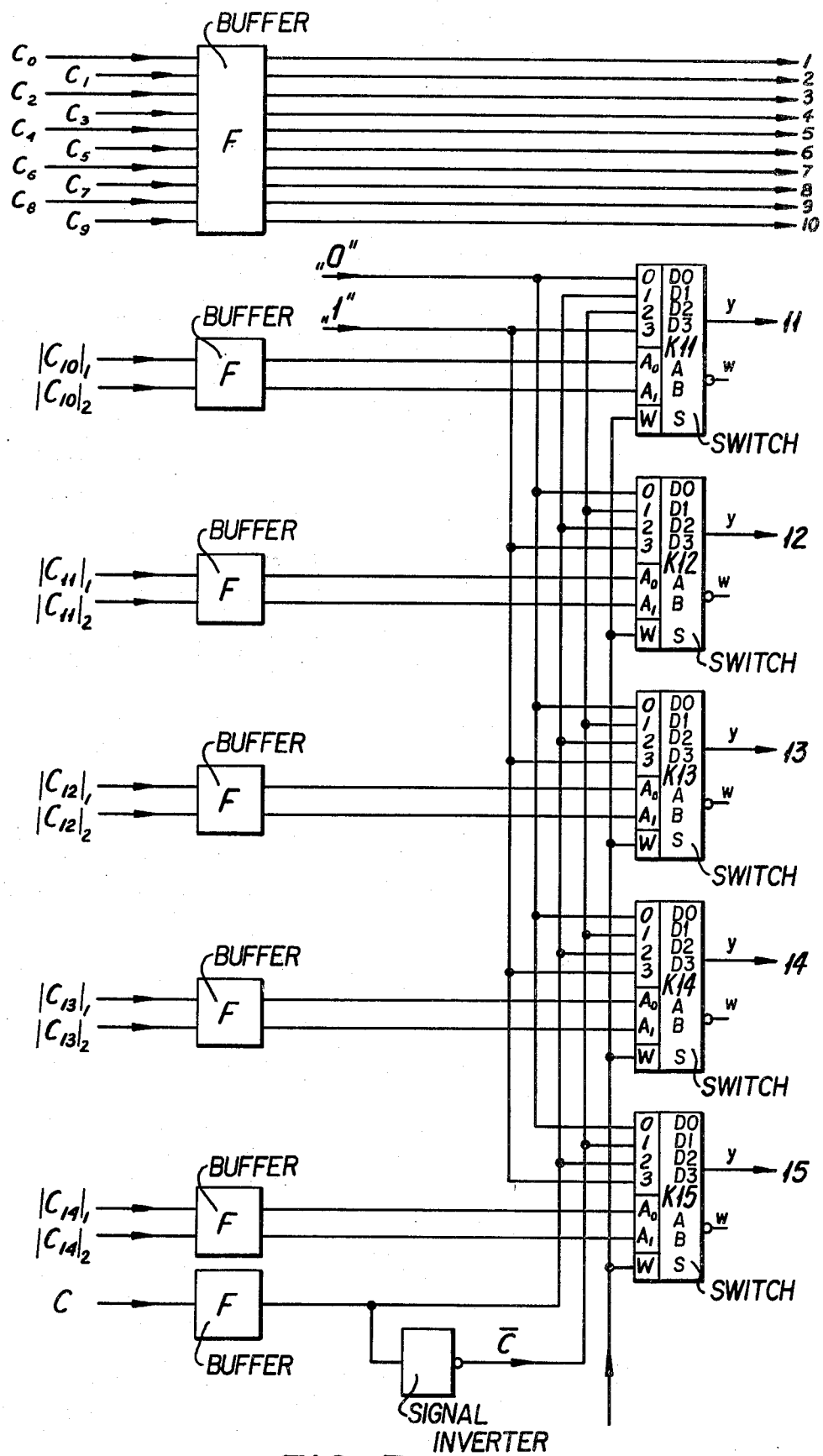
FIG. 3 is a functional diagram of the converter.

In the first column of the Table 3, 32 states of the fine read-out scale are fixed (reduced to the coarse read-out scale) where the graduation transitions occur on the line II—II. Binary patterns of the optocouples for every digit are shown, depending on which one of the inputs G, C, "0" or "1" is switched to the information bus (FIG. 3). Digital switches control algorithm can be built up using Tables 1, 2 and 3.

An example of the algorithm built up sequence for control of 11th digit switch $K_{11}$ is given below (FIG. 3). The procedure is identical for the other switches.

In the code masks $M_1$ and $M_2$ position, shown in FIG. 2, the optocouples $(C_{10})_1$ and $(C_{10})_2$, which control $K_{11}$ switch, are covered by opaque graduation of the digital track and have binary value "00" on their outputs.

If read photodiodes were placed on the fictive readout line II—II then, according to the mask position shown, a signal with logical level "0" should be sent from the read photodiode output of the 11th digit to the information bus. Therefore a logical level "0" will be sent to the 11th digit switch output when binary value "00" is applied to the inputs $A_0$ and $A_1$.

Using Table 1, one can determine that applying binary value "00" to the inputs $A_0$ and $A_1$, the input 0 is connected to the switch output. Therefore the source line "0" must be switched to this input (FIG. 3). Thus in all cases when the optocouples are covered at the same time by an opaque graduation, a logical level "0" is supplied to the 11th digit information line. After a fine read-out scale half turn $\pi$ just over the read-out line X—X (FIG. 2) of the imitating C a graduation transition from opaque to transparent is performed (Table 2 for odd number $\pi$), and on the non-inverted output of C (FIG. 3)-a transition from "0" to "1". At the same time the inverted output $\bar{C}$ changes its state from "1" to "0". Thus on every half turn both transitions of $M_1$ can be imitated using the inverted and the non-inverted outputs of the photodiode C.

When the code mask $M_1$ is turned clockwise through angle $\pi$ from the position shown in FIG. 1, the mask $M_2$ will turn through angle $\pi/16$ and a transition from opaque to transparent graduation on the fictive read-out line II—II will occur. Therefore the non-inverted output of the photodiode C, imitating the mentioned above transition, at that time must be already switched to the 11th digit information line (Table 2 for odd $\pi$).

The binary value of the photodiodes $(C_{10})_1$ and $(C_{10})_2$ is "10" for the discussed new position of the $M_1$ and $M_2$ scales (Table 3, column $\pi/i$) and while, on this value, the non-inverted output C must be connected to the bus 11, this output must be connected to the input 1 of the digital switch (Table 1 for value "10"). This state of the switch is held until the binary value applied to its inputs $A_0$ and $A_1$ is "10", in this case from rotation angle $\pi/2.16$ till $3\pi/2.16$ for $M_2$ and from $\pi/2$ till $3\pi/2$ for $M_1$.

Thus in this and all other cases the imitating photodiode C is connected to the information bus corresponding digit for a quarter of turn before the graduation transition on the line I—I and is disconnected a quarter of turn after that. As a result of this, the allowable range of the reduced to the fine read-out scale instrumentation error, due to non-symmetrical orientation of the optocouples to the fictive read-out line II—II, unproper adjustment of the angle $\rho$ value, mask $M_2$ manufacturing unaccuracy, gear transmission play value, can reach $\pm \pi/2$. This significantly lowers constructional and technological requirements to all elements of the encoder but the mask $M_1$. Because the information for the moving object current position is read out only from the code mask $M_1$ (the mask $M_2$ is auxiliary), conversion accuracy depends only on the precision of manufacturing mask $M_1$. Thus, in spite of two scale presence, practically the metrogical requirements to the multiturn encoding unit, realizing the proposed invention, are reduced to those of one scale encoding units. Using Tables 1, 2 and 3, in a similar way one can determine that the outputs "1" and "C" (FIG. 3) must be connected to the inputs 3 and 2 of the 11th digit switch respectively.

Thus the rotation of the masks $M_1$ and $M_2$ is converted into Gray code with step $2\pi/2^{15}$ for $M_1$ and $2\pi/2^{15.16}$ for $M_2$.

In some cases the imitating photodiode C can be located over the 10th digit track; then its read-out line is turned clockwise at an angle of $\pi/2$. Because the conversion accuracy of the $M_2$ scale rotation into Gray code depends on the precision manufacturing of the imitating photodiode C track graduations, as well as on the orientation accuracy to the other mask $M_1$ digit graduations, it is quite reasonable to locate this track on the outermost side of the periphery of the fine read-out scale.

TABLE 1

| Control inputs logical states | | Number of input switched to the output |
|---|---|---|
| $A_0$ | $A_1$ | |
| 0 | 0 | 0 |
| 1 | 0 | 1 |
| 0 | 1 | 2 |
| 1 | 1 | 3 |

TABLE 2

| | Number $\pi$ turns of the mask $M_1$ | | | |
|---|---|---|---|---|
| | Even number $\pi$ | | Odd number $\pi$ | |
| Outputs of the imitating element C | logic level change | graduation transition imitation of $M_2$ | logic level change | graduation transition imitation of $M_2$ |
| noninverted output C | 1–0 | transparent-opaque | 0–1 | opaque-transparent |
| inverted output C | 0–1 | opaque-transparent | 1–0 | transparent-opaque |

TABLE 3

| angle | $(C_{10})_1(C_{10})_2 11$ | | | $(C_{11})_1(C_{11})_2 12$ | | | $(C_{12})_1(C_{12})_2 13$ | | | $(C_{13})_1(C_{13})_2 14$ | | | $(C_{14})_1(C_{14})_2 15$ | | |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 1 | C |
| $1\pi/i$ | 1 | 0 | C | 0 | 0 | 0 | 0 | 0 | 0 | 0 | 0 | 0 | 0 | 0 | 0 |
| $2\pi/i$ | 1 | 1 | 1 | 1 | 0 | $\overline{C}$ | 0 | 0 | 0 | 0 | 0 | 0 | 0 | 0 | 0 |
| $3\pi/i$ | 0 | 1 | $\overline{C}$ | 1 | 1 | 1 | 0 | 0 | 0 | 0 | 0 | 0 | 0 | 0 | 0 |
| $4\pi/i$ | 0 | 0 | 0 | 1 | 1 | 1 | 1 | 0 | $\overline{C}$ | 0 | 0 | 0 | 0 | 0 | 0 |
| $5\pi/i$ | 1 | 0 | C | 1 | 1 | 1 | 1 | 1 | 1 | 0 | 0 | 0 | 0 | 0 | 0 |
| $6\pi/i$ | 1 | 1 | 1 | 0 | 1 | C | 1 | 1 | 1 | 0 | 0 | 0 | 0 | 0 | 0 |
| $7\pi/i$ | 0 | 1 | $\overline{C}$ | 0 | 0 | 0 | 1 | 1 | 1 | 0 | 0 | 0 | 0 | 0 | 0 |
| $8\pi/i$ | 0 | 0 | 0 | 0 | 0 | 0 | 1 | 1 | 1 | 1 | 0 | $\overline{C}$ | 0 | 0 | 0 |
| $9\pi/i$ | 1 | 0 | C | 0 | 0 | 0 | 1 | 1 | 1 | 1 | 1 | 1 | 0 | 0 | 0 |
| $10\pi/i$ | 1 | 1 | 1 | 1 | 0 | $\overline{C}$ | 1 | 1 | 1 | 1 | 1 | 1 | 0 | 0 | 0 |
| $11\pi/i$ | 0 | 1 | $\overline{C}$ | 1 | 1 | 1 | 1 | 1 | 1 | 1 | 1 | 1 | 0 | 0 | 0 |
| $12\pi/i$ | 0 | 0 | 0 | 1 | 1 | 1 | 0 | 1 | C | 1 | 1 | 1 | 0 | 0 | 0 |
| $13\pi/i$ | 1 | 0 | C | 1 | 1 | 1 | 0 | 0 | 0 | 1 | 1 | 1 | 0 | 0 | 0 |
| $14\pi/i$ | 1 | 1 | 1 | 0 | 1 | C | 0 | 0 | 0 | 1 | 1 | 1 | 0 | 0 | 0 |
| $15\pi/i$ | 0 | 1 | $\overline{C}$ | 0 | 0 | 0 | 0 | 0 | 0 | 1 | 1 | 1 | 0 | 0 | 0 |
| $16\pi/i$ | 0 | 0 | 0 | 0 | 0 | 0 | 0 | 0 | 0 | 1 | 1 | 1 | 1 | 0 | $\overline{C}$ |
| $17\pi/i$ | 1 | 0 | C | 0 | 0 | 0 | 0 | 0 | 0 | 1 | 1 | 1 | 1 | 1 | 1 |
| $18\pi/i$ | 1 | 1 | 1 | 1 | 0 | $\overline{C}$ | 0 | 0 | 0 | 1 | 1 | 1 | 1 | 1 | 1 |
| $19\pi/i$ | 0 | 1 | $\overline{C}$ | 1 | 1 | 1 | 0 | 0 | 0 | 1 | 1 | 1 | 1 | 1 | 1 |
| $20\pi/i$ | 0 | 0 | 0 | 1 | 1 | 1 | 1 | 0 | $\overline{C}$ | 1 | 1 | 1 | 1 | 1 | 1 |
| $21\pi/i$ | 1 | 0 | C | 1 | 1 | 1 | 1 | 1 | 1 | 1 | 1 | 1 | 1 | 1 | 1 |
| $22\pi/i$ | 1 | 1 | 1 | 0 | 1 | C | 1 | 1 | 1 | 1 | 1 | 1 | 1 | 1 | 1 |
| $23\pi/i$ | 0 | 1 | $\overline{C}$ | 0 | 0 | 0 | 1 | 1 | 1 | 1 | 1 | 1 | 1 | 1 | 1 |
| $24\pi/i$ | 0 | 0 | 0 | 0 | 0 | 0 | 1 | 1 | 1 | 0 | 1 | C | 1 | 1 | 1 |
| $25\pi/i$ | 1 | 0 | C | 0 | 0 | 0 | 1 | 1 | 1 | 0 | 0 | 0 | 1 | 1 | 1 |
| $26\pi/i$ | 1 | 1 | 1 | 1 | 0 | $\overline{C}$ | 1 | 1 | 1 | 0 | 0 | 0 | 1 | 1 | 1 |
| $27\pi/i$ | 0 | 1 | $\overline{C}$ | 1 | 1 | 1 | 1 | 1 | 1 | 0 | 0 | 0 | 1 | 1 | 1 |
| $28\pi/i$ | 0 | 0 | 0 | 1 | 1 | 1 | 0 | 1 | C | 0 | 0 | 0 | 1 | 1 | 1 |
| $29\pi/i$ | 1 | 0 | C | 1 | 1 | 1 | 0 | 0 | 0 | 0 | 0 | 0 | 1 | 1 | 1 |
| $30\pi/i$ | 1 | 1 | 1 | 0 | 1 | C | 0 | 0 | 0 | 0 | 0 | 0 | 1 | 1 | 1 |
| $31\pi/i$ | 0 | 1 | $\overline{C}$ | 0 | 0 | 0 | 0 | 0 | 0 | 0 | 0 | 0 | 1 | 1 | 1 |

We claim:

1. In a method for readout from multiscale encoders having coarse and fine readout masks, wherein the fine readout digits information signals are formed in Gray code immediately by the read elements of the fine readout mask, and for every digit of the coarse readout mask there is formed by analogy in Gray code an auxiliary pair of signals, and comprising anticipating and delaying electrical signals dephased with respect to the theoretical information signal of the corresponding coarse readout digit of an angle equal to half of the angle discretion of the coarse readout mask, the improvement comprising forming the actual coarse readout information signals in Gray code without the immediate participation of the read elements of the coarse readout mask, dividing the period of the theoretical information signal of every coarse readout digit into four intervals which are coded with the aid of four binary patterns 00, 10, 01, and 11 which are formed from logical levels "0" and "1" of the corresponding auxiliary pair of signals, in the intervals of the period that are coded by binary patterns 00 and 11 forming the logical levels "0" and "1" of the actual information signals of all coarse readout digits in accordance with the Gray code, switching on a common source of logical level "0" and a common source of logical level "1" in the remaining intervals coded by binary patterns 10 and 01, the front and rear edges of all actual coarse readout information signals being formed where, according to the Gray code, the inverted and the non-inverted imitating signal is used, which is equal in form and periodicity with the information signal of the highest-ranking fine readout digit and is dephased in accordance to in a quarter of its period and is formed by an additional read element of the fine readout mask.

2. A multiturn absolute "angle-code" converter, comprising a code mask for fine readout in Gray code, the fine readout mask being kinematically joined to a code mask for coarse readout in Gray code by a speed reducing gear transmission with speed transmission value equal to the maximum allowable number of turns of the mask for fine readout, readout elements for every digit of the coarse readout mask, said readout elements being located along the readout line of the mask for fine readout, a plurality of auxiliary couples, each couple comprising anticipating and delaying readout elements located symmetrically with respect to a fictive digital track over the coarse readout mask, the angle formed between the readout elements being equal to the angle of discretion of the coarse readout mask, and an electronic circuit for the formation of the information signals for the fine and coarse readout, an angle code converter having an information bus, the circuit being interposed between the readout elements of the two code masks and the information bus of the angle code converter, between the readout elements of the fine readout mask there is interposed an imitating delaying sensing element which has an angle of $\pi/2$ in relation to the readout element of the highest-ranking digit for readout and is located over a code track which corresponds to the highest-ranking digit of the fine readout mask, the circuit for the formation of the information signals for coarse readout comprising a multiplexor which has four controlled inputs that are coded in the decimal system with the figures 0, 1, 2 and 3 which can be switched onto the output of the multiplexor in accordance to their binary equivalents formed by four logical states 00, 10, 01 and 11 of the two controlling inputs of the multiplexor, coded in the binary system in accordance with the figures $2^0$ and $2^1$; the output of the multiplexor being connected to the information bus of the corresponding coarse readout digit, the controlling inputs $2^0$ and $2^1$ of the multiplexor being connected to the anticipating and delaying read elements of the auxiliary couple of the given coarse readout digit, the controlling inputs 0 and 3 of the multiplexors for all coarse readout digits being connected to a source of logical level "0" and a source of logical level "1"; the controlled figure inputs 1 and 2 of the multiplexor of the low-ranging coarse readout digit being joined according to the non-inverted and the inverted output of the imitating sensitive element; and the controlled figure inputs 1 and 2 of the multiplexors of all remaining coarse readout digits are joined according to the inverted and the non-inverted output of the imitating sensitive element.

* * * * *